(12) United States Patent
Cranford, Jr. et al.

(10) Patent No.: US 7,403,057 B2
(45) Date of Patent: Jul. 22, 2008

(54) CML DELAY CELL WITH LINEAR RAIL-TO-RAIL TUNING RANGE AND CONSTANT OUTPUT SWING

(75) Inventors: Hayden C. Cranford, Jr., Cary, NC (US); Marcel A. Kossel, Reichenburg (CH); Thomas E. Morf, Gross (CH)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 11/556,882

(22) Filed: Nov. 6, 2006

(65) Prior Publication Data

US 2008/0129356 A1 Jun. 5, 2008

(51) Int. Cl.
*H03H 11/26* (2006.01)

(52) U.S. Cl. .................. 327/280; 327/274; 327/287

(58) Field of Classification Search ................. 327/264, 327/266, 272, 274, 278, 280, 281, 285, 287, 327/288

See application file for complete search history.

(56) References Cited

U.S. PATENT DOCUMENTS

| | | | |
|---|---|---|---|
| 6,157,266 A * | 12/2000 | Tsai et al. ................... 331/57 |
| 6,294,962 B1 * | 9/2001 | Mar ............................ 331/57 |
| 6,771,105 B2 * | 8/2004 | Andrasic et al. ............ 327/276 |
| 6,943,606 B2 * | 9/2005 | Dunning et al. ............. 327/231 |
| 2004/0051573 A1 | 3/2004 | Schrodinger | |

* cited by examiner

*Primary Examiner*—N. Drew Richards
*Assistant Examiner*—An T. Luu
(74) *Attorney, Agent, or Firm*—Cantor Colburn LLP; Josh Cockburn

(57) ABSTRACT

A current mode logic (CML) delay cell with linear rail-to-rail tuning range and constant output swing. The CML delay cell can include a tuning voltage input on a first and second transistor, contributing to a CML delay cell load, and a bias voltage input on a third transistor, as a current source $I_0$, and a compensation circuit having switching point optimized inverters having a first plurality of transistors having a transconductance $\beta_{pN}$ and a second plurality of transistors having a transconductance $\beta_{nN}$, wherein respective ratios of $\beta_{nN}/\beta_{pN}$ determine an inverter switching point of respective switching point optimized inverters, the first and second plurality of transistors having gates coupled to the tuning voltage input of the CML delay cell, wherein the switching point optimized inverters are followed by weighted tail current sources $M_{0N}$ that supply additional currents to the current source $I_0$ at a drain node of the third transistor.

5 Claims, 3 Drawing Sheets

CML DELAY CELL WITH LINEAR RAIL-TO-RAIL TUNING RANGE AND CONSTANT OUTPUT SWING

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to current mode logic (CML) circuits, and particularly to a CML delay cell with linear rail-to-rail tuning range and constant output swing.

2. Description of Background

Delay cells in current mode logic (CML) technology are frequently used in high-speed ring oscillators for phase locked loop (PLL) circuits or in delay locked loops. A typical delay cell includes a tail current source $I_0$, a different transistor pair $M_1$, $M_2$ and a variable RC-load, with the variable load capacitances implemented by PMOS load transistors. The RC-load determines the delay cell's time constant $\tau$, in a PLL application $\tau$ is inverse proportional to the oscillation frequency given as $f_{osc} = \frac{1}{2}N\tau$ and in a DLL application $\tau$ corresponds to the desired delay of the input signal, where N denotes the number of delay cell stages. Ideally $\tau$ gets changed only by a variation of the load capacitance and not by a variation of the load resistor because the output common mode level is determined by $V_{DD} - R \cdot I_0/2$. A variation of R would result in an undesired variation of the delay cell's common mode levels, which results in a shift of the circuit's quiescent points. When implementing the CML delay cell on transistor-level, a variation of R is virtually inevitable because the output conductance $g_{ds}$ of the PMOS transistor used as variable C also gets affected by a variation of $\tau$. However in the case of using PMOS load transistors, the load resistance successively decreases the more the transistor is turned on and the smaller the delay constant $\tau$ becomes. On the other hand, the load resistance and capacitance remain unchanged when the tuning voltage is below the PMOS transistor's threshold voltage ($v_{tune}$ between 0.7V to 1.0V=$V_{dd}$). As a consequence of the non-constant load resistance above the threshold voltage of the PMOS load transistor, the output common mode voltage increases with decreasing load capacitance. This undesired behavior can be partially eliminated by increasing the tail current $I_0$ depending on the load's nonlinearity. For instance when using an output common mode regulation scheme such as the replica biasing scheme, the output common mode is held constant if the load resistance changes as the replica biasing control adjusts the gate bias of the tail current source correspondingly. The tail current increases as much as the load resistance decreases. This compensation or common mode regulation works fine in the middle of the tuning range. However at the upper limit where $v_{tune}$ approaches the PMOS threshold voltage and at the lower limit towards $v_{tune} < 20\%$ of $V_{dd}$ where the linear range of the replica biasing control ends, the compensation does not work very well. Exactly in these two ranges the compensation method proposed by adding additional switched current sources comes into play.

The principle of operation outlined above used for the linearization of a delay cell with PMOS load transistors can be applied analogously for the linearization of delay cells with NMOS load transistors. The polarities and devices types explained above then change correspondingly.

BRIEF SUMMARY

Exemplary embodiments include an electronic circuit arrangement, including a current mode logic (CML) delay cell having an input tuning voltage on a gate of a first and second transistor, contributing to a load of the CML delay cell, and a bias voltage input on a gate of a third transistor, as a current source $I_0$ and a compensation circuit having a plurality of switching point optimized inverters having a first plurality of transistors having a transconductance $\beta_{pN}$ and a second plurality of transistor having a transconductance $\beta_{nN}$, wherein respective ratios of $\beta_{nN}/\beta_{pN}$ determine an inverter switching point of a respective one of the switching point optimized inverters, the first and second plurality of transistors having gates coupled to the tuning voltage input of the CML delay cell, wherein the switching point optimized inverters are followed by weighted tail current sources $M_{0N}$ that supply additional currents to the current source $I_0$ at a drain node of the third transistor.

Additional embodiments include a method in a current mode logic (CML) delay cell circuit, a method for providing a wide tuning range and constant output swing, the method including providing a CML delay cell having a nonlinear time constant as a function of the CML, delay cell tuning voltage and coupling a compensation circuit to the CML delay cell, the compensation circuit having a plurality of inverters that control weighted tail currents, each of the inverter switching points is determined by a transconductance ratio $\beta_{nN}/\beta_{pN}$, the transconductance being determined by $\beta_x = KP_x \cdot W_x/L_x$.

Further embodiments include a current mode logic delay cell circuit having a linearized time constant, the circuit including a $V_{dd}$ powder supply terminal connected to drains of a first set of transistors, each of the pair of transistors arranged in parallel with a resistor, wherein the sources of the transistors are connected to differential output terminals, a tuning input terminal vtune connected to gates of a first plurality of transistors and to gates of the first set of transistors, the first plurality of transistors having transistor pairs forming an inverter characterized as having a switching point defined by $\beta_{nN}/\beta_{pN}$ and a second set of transistors having drains respectively coupled to the differential transistor pair of the delay cells, the second set of transistors providing a tail current source weight, the sources of the second set of transistors connected to ground, wherein gates of the second plurality of transistors is connected to a source of one of the transistors of the transistor pair and to a drain of the other of the transistors of the transistor pair.

Other systems, methods, and/or computer program products according to embodiments will be or become apparent to one with skill in the art upon view of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
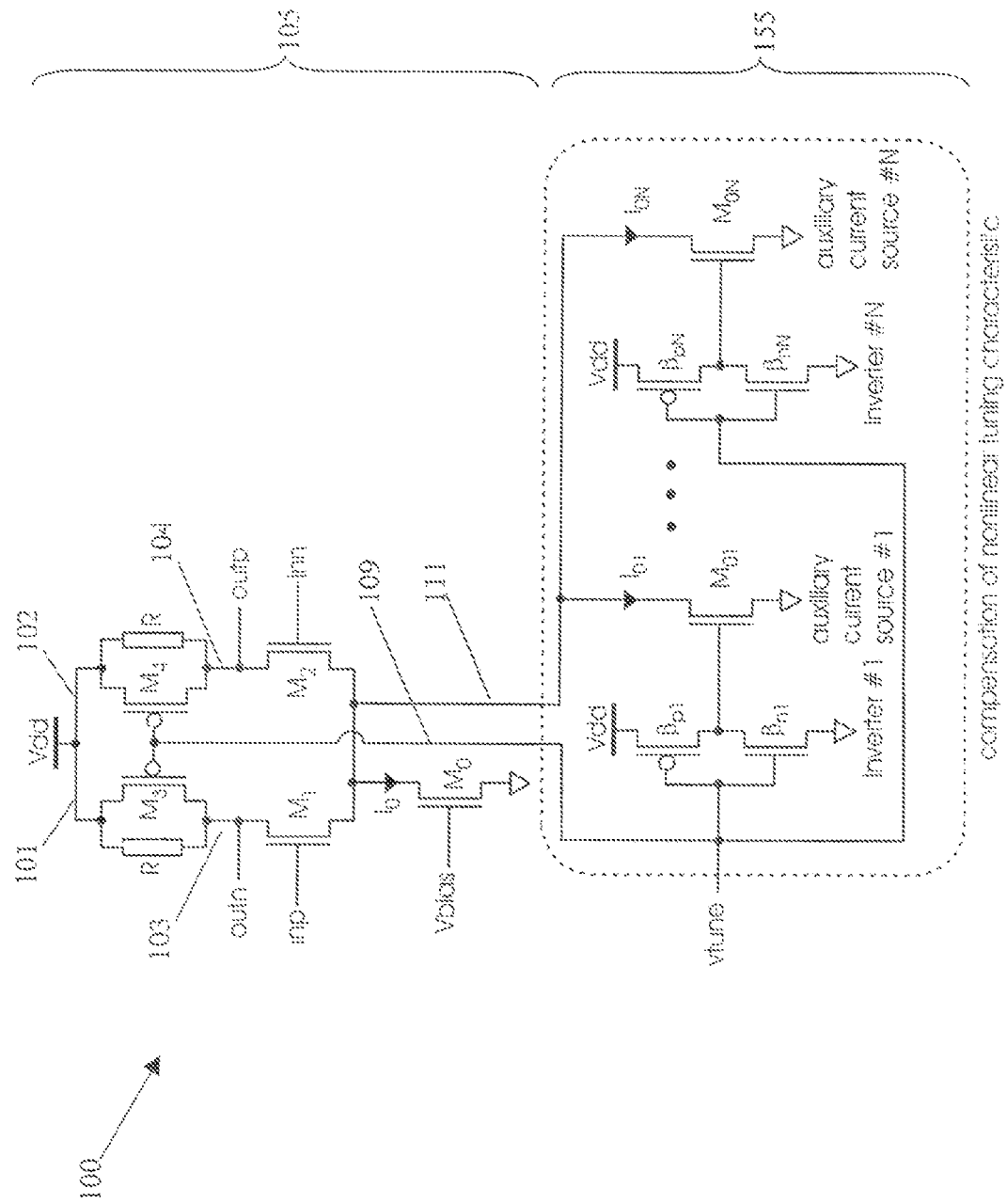
FIG. 1 illustrates an exemplary embodiment of a CML delay cell with linear rail-to-rail tuning range and constant output swing.

The detailed description explains the preferred embodiments of the invention, together with advantages and features, by way of example with reference to the drawings.

DETAILED DESCRIPTION

Exemplary embodiments include a system and method for extending the tuning range of a CML cell. In accordance with exemplary embodiments, CML cells can be linearly tuned from rail-to-rail with a constant output swing. Aforementioned embodiments include compensating the non-linearity of the delay cell's RC-load by a weighted addition of additional tail current sources. Inverters are used with different switching points for the addition of the extra tail current sources. In exemplary implementations, the delay cell's non-linear $\tau(v_{tune})$-characteristic is compensated by additional weighted tail current sources, which are turned on according to the characteristic of different inverter switching points that are controlled by the delay cell's tuning voltage. The different switching points of the inverters reflect the inverse non-linearity of the RC-load to compensate its non-ideality. The input of the inverter bank is directly derived from the tuning signal. In exemplary implementations, two degrees of freedom are available. The two degrees of freedom are defined by $\beta_x$ transconductance parameter defined as $\beta_x = KP_x \cdot W_x/L_x$ with x=NMOS or PMOS, which is discussed further in the description below. The parameter KP denotes the carrier mobility of the NMOS or PMOS filed-effect transistor devices and W and L denotes the transistors' channel width and length. Furthermore, the two degrees of freedom that are available to compensate the delay cell's nonlinearity are as follows: (1) variation of inverter switching point $(\beta_n/\beta_p)$; and (2) choice of extra tail current source weights $(I_{ON})$. The inverter switching points, the current weighting factor or a combination of the two can be chosen to linearize the delay cell's tuning characteristic such that a linear rail-to-rail tuning range with constant output swing across the whole tuning range is obtained.

Furthermore, the extended tuning range of the CML cell can be detected by the measurement of the delay cell's current consumption. When the measured current consumption is plotted against the PLL's output frequency, the compensation of the delay cell's nonlinearity can be directly observed in the resulting I(f)-characteristic. The current consumption and the output frequency are accessible from outside the circuit.

Thus, a digital approach (i.e., the additional current sources are completely switchblade on or off), without actually using a dedicated analog-to-digital (ADC) or digital-to-analog (DAC) converters, is attained. In addition, the adjustment of the tail currents uses little additional power consumption as the inverters, consume no current in their static states (in contrast to DACs or ADCs). The two degrees of freedom allow to sufficiently compensate the load's non-linearity to obtain the aforementioned linearized tuning range with constant output swing.

Exemplary embodiments include an electronic circuit arrangement, including a current mode logic (CML) delay cell having a tuning voltage input on a gate of a first and second transistor that constitute together with the load resistors the delays cell's load and a bias voltage input on a gate of a third transistor that acts as current source for the differential pair of the delay cell. Furthermore a compensation circuit is included that consists of a set of inverter sections with a first set of transistors having a transconductance $\beta_{pN}$ and a second set of transistor having a transconductance $\beta_{nN}$, wherein respective ratios of $\beta_{nN}/\beta_{pN}$ determine an inverter switching point of a respective one of the set of inverter sections. The gates of the first and second set of transistors are coupled to the tuning voltage input of the CML delay cell. Each individual inverter in the set of inverter's is connected with its output to the gate of a weighted current source. All weighted sources are operated in parallel to the main current source of the delay cell in order to compensate for its nonlinear load characteristic.

Additional embodiments includes a method for providing a wide tuning range and constant output swing in a CML delay cell, the method including providing a (CML) delay cell having a nonlinear time constant as a function of the CML delay cell tuning voltage and coupling a compensation circuit to the CML delay cell, the compensation circuit having a set of inverters that control weighted tail currents, each of the inverter switching points is determined by a transconductance ratio $\beta_{nN}/\beta_{pN}$, the transconductance being determined by $\beta_x = KP_x \cdot W_x/L_x$. The inverter switching points are optimized for reducing the delay cell's nonlinearity with respect to the $\tau$-versus-tuning voltage characteristic.

FIG. 1 illustrates an exemplary embodiment of a CML delay cell circuit 100. As described above, the delay cell circuit 100 can achieve linear rail-to-rail tuning range and constant output swing by having the delay cell's non-linear characteristic compensated by additional weighted tail current sources, which are turned on according to the characteristic of different inverter switching points, controlled by the delay cells' tuning voltage. The CML delay circuit 100 has external connections to power supply terminals (Vdd, Vbias and vtune); to a first pair of differential data input terminals (inn and inp) and to a pair of differential data output terminals (outn and outp).

The CML delay cell circuit 100 generally includes a delay cell section 105 and a compensation circuit section 155. The delay cell section 105 includes MOS transistors M0, M1, M2, M3, M4 and resistors R arranged in parallel with transistors M3, M4. The compensation circuit section 155 includes transistors represented by $\beta_{p1} \ldots \beta_{pN}$, and $\beta_{n1} \ldots \beta_{nN}$, transistors $M_{01} \ldots M_{0N}$, supplied with tail current sources $I_{01} \ldots I_{0N}$, and inverters 1 . . . N. As mentioned above, the transistors are represented by their transconductance values, $\beta_x = KP_x \cdot W_x/L_x$ with x=NMOS or PMOS. The respective inverter switching sections 1 . . . N, have respective inverter switching points $\beta_n/\beta_p$, as discussed above, which can be selectively chosen by varying the values of respective transconductance values $\beta_x = KP_x \cdot W_x/L_x$ with x=NMOS or PMOS. The parameter $KP_x$ is given by the technology and the transconductance value can only be varied by choosing different $W_x/L_x$-ratios.

In the delay cell section 105, the power supply terminal Vdd is connected to a first lead 101 of the resistor R and transistor M3 loop and a first lead 102 of the resistor R and transistor M4 loop. Power supply terminal Vdd is also connected to inverter sections 1 . . . N. A second lead 103 of the resistor R and transistor M3 loop is connected to the data output terminal outn, while a second lead 104 of the resistor R and transistor M4 loop is connected to the data output terminal outp. Further connected to the data output terminal outn are the drains of the transistors M1 and M2, respectively.

The gate of the transistor M1 is connected to the data input terminal inp while the gate of the transistor M2 is connected to the data input terminal inn. The power supply terminal Vbias is connected to the gate of transistors M0, and the source of transistor M0 is connected to ground.

Referring still to the delay cell section 105 and the compensation circuit section 155, the gates of transistors M3, M4 are connected to the input terminal vtune, via lead 109. The input terminal vtune is further connected to the gates of transistors having the tuned transconductance inverter switching points $\beta_n/\beta_p$. The different transistor pair M1, M2 drains the tail currents $I_{O1} \ldots I_{ON}$, via lead 111, which in turn is connected to the drains of transistors $M_{01}, \ldots M_{0N}$, the sources of which, in turn, connected to ground, and provides the auxiliary current sources 1 ... N. The sources of transistors having transconductance $\beta_{n1} \ldots \beta_{nN}$ are connected to ground.

It is now further appreciated that the operation of the CML delay cell circuit 100 is linearized to enable a rail-to-rail tuning with constant output swing. The nonlinear tuning characteristics of the delay cell section 105 is compensated by the tuning on of the different inverter 1 ... N switching points which are determined by $\beta_n/\beta_p$ which can be pre-determined. The tuning voltage vtune of the delay cell section 105 is used as the control voltage of the inverter switching points by supplying the gates of transistors having transconductance $\beta_{p1} \ldots \beta_{pN}$, and $\beta_{n1} \ldots \beta_{nN}$.

Figure 2:
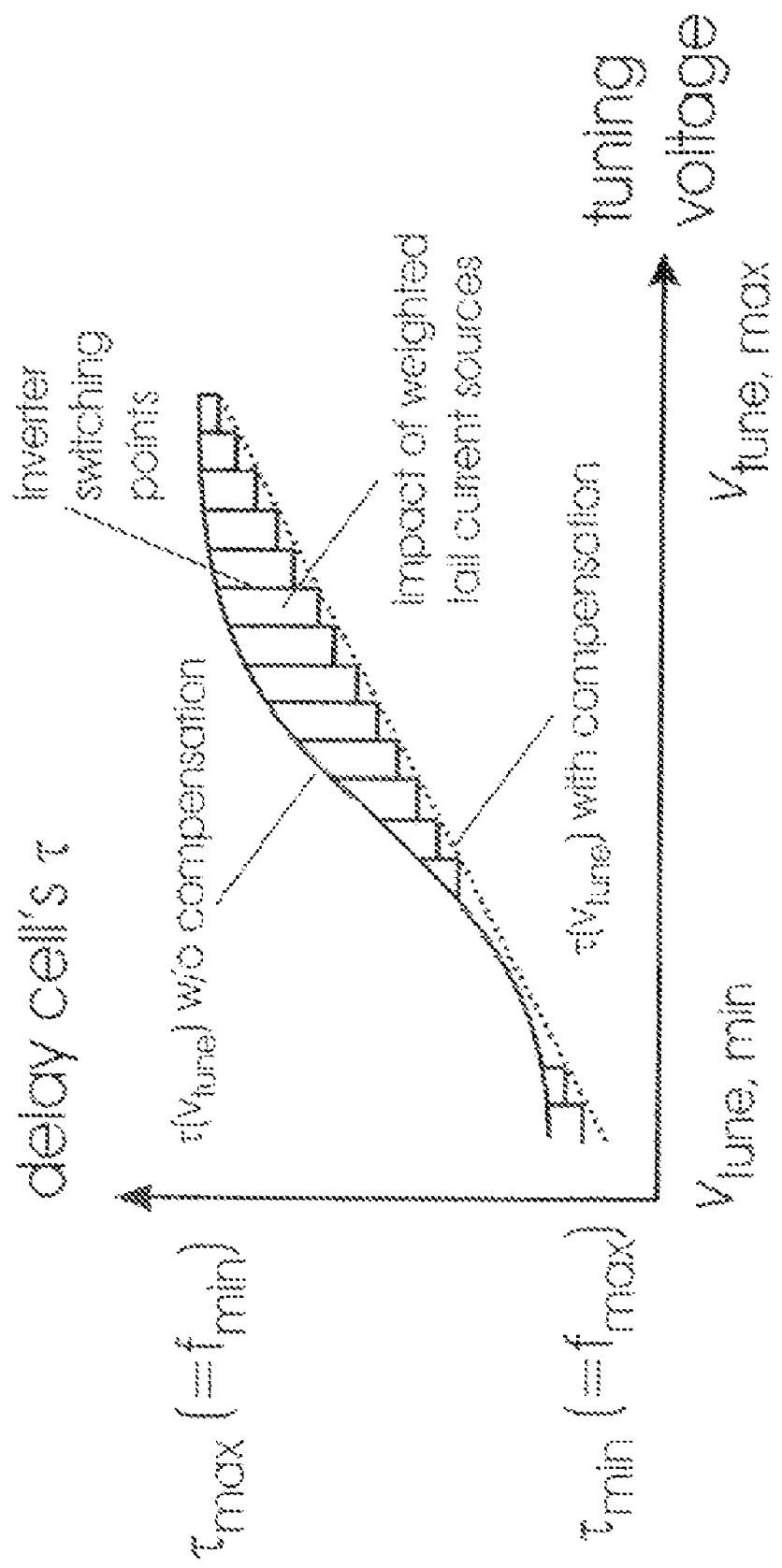
FIG. 2 illustrates a plot of an exemplary delay cell's time constant versus tuning voltage diagram illustrating the exemplary principle of operation in accordance with the exemplary embodiments.

FIG. 2 illustrates a plot of an exemplary delay cell's time constant versus tuning voltage illustrating exemplary principle of operation in accordance with exemplary embodiments. It is therefore appreciated that the weighted tail current sources aid to shift the non-linear characteristics of the delay cell's time constant τ, by having varying switching points as discussed above. Therefore, as needed, the τ can be shifted by selectively choosing the inverter switching points in the compensation circuit section 155.

As mentioned in the description above, the limited linear tuning range of a replica based CML delay cell or a delay cell without replica biasing, can be significantly extended by a weighted addition of some extra trail current sources. In general, the tuning voltage level at which the additional tail current sources switch on, determine the linearization process. Therefore, in exemplary embodiments, inverters that have different switching points are implemented. When choosing different transistor width ratios $W_{NMOS}/W_{PMOS}$ or different transconductance parameter ratios $\beta_n = KP_n \cdot W_{NMOS}/L_{NMOS}$ over $\beta_p = KP_p \cdot W_{PMOS}/L_{PMOS}$, respectively, the inverters switch their logical states at different input voltage levels.

Figure 3:
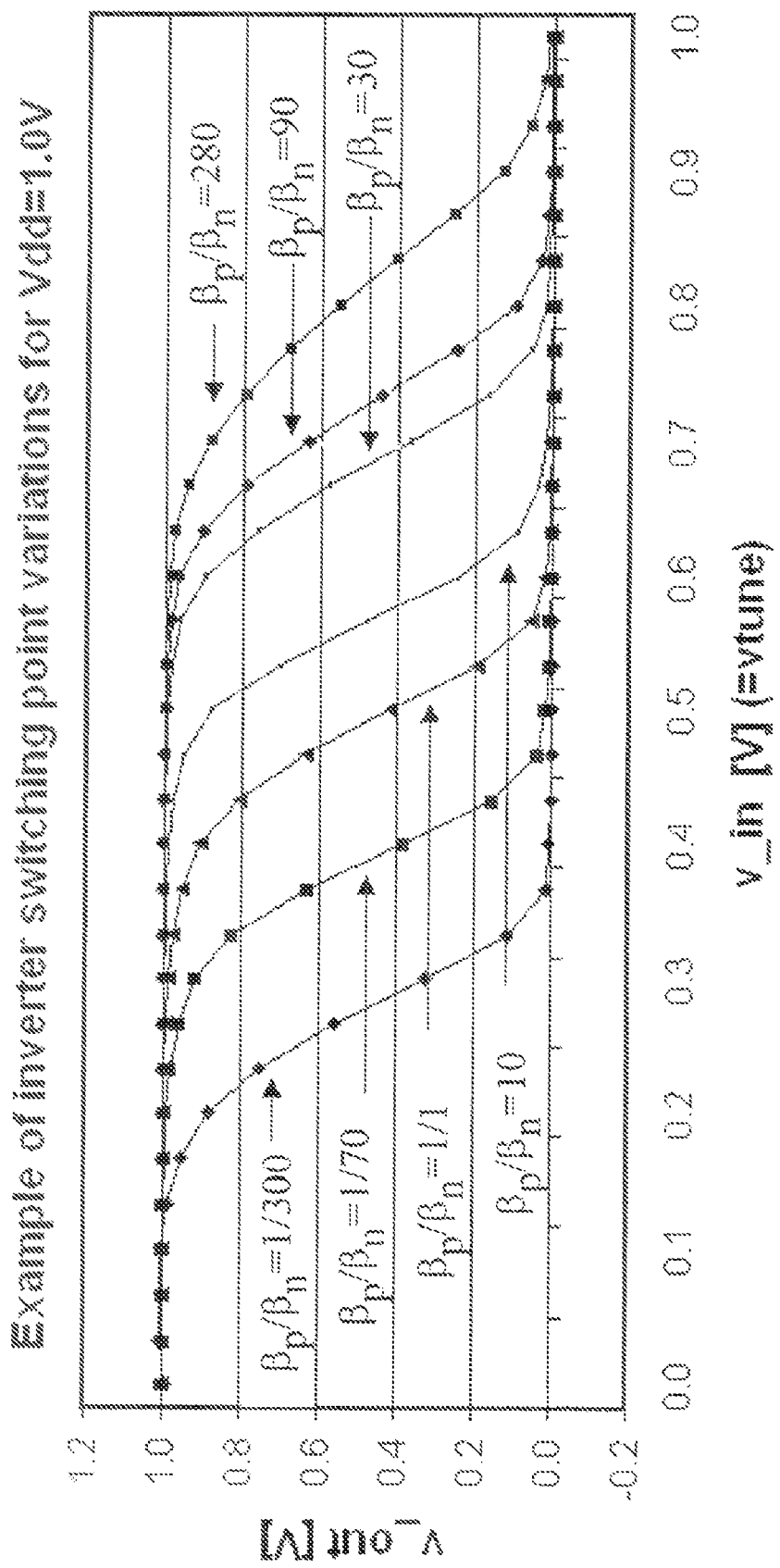
FIG. 3 illustrates a plot of an exemplary inverter switching point variation as a function of the tuning voltage in accordance with the exemplary embodiments.

Referring now to FIG. 3 that illustrates a plot of an exemplary inverter switching point variation as a function of tuning voltage in accordance with exemplary embodiments, the inverter characteristics for different $\beta_p/\beta_n$-ratios are displayed. The higher $\beta_p/\beta_n$ is, the higher the input voltage can be in order to switch the inverter's logical state. By an appropriate choice of the $\beta_p/\beta_n$-ratio and the size of the additional tail current sources, the tuning range becomes significantly extended. Owing to the extended tuning range by turning on additional weighted current sources, the delay cell's amplitude does not fade in the tuning range region where τ becomes small and therefore the delay cell's swing also becomes constant.

It is appreciated by those skilled in the art that convention CML delay cells without replica biasing having curves that make it clearly visible that the amplitude and common mode level are significantly changing within the tuning voltage range applied, which corresponds to the horizontal axis. In contrast, in accordance with a transistor implementation of the systems and methods in accordance with exemplary embodiments, a linearized CML delay cell, it is clear that the linearization process by switching on additional tail current sources via switching point optimized inverter stages not only extends the tuning range but also reduces the VCO gain, which has a positive effect on the jitter performance.

The method proposed for extending the linearization range of CML delay cells offers the following features: lower $K_{VCO}$ leading to better jitter performance; wider tuning range, which may increase yield; constant output swing; simple and efficient implementation to extend the linear tuning range of CML delay cells (an extended tuning range also helps cover process variations); no extra power required (no DAC or ADC required); two degrees of freedom (either scaling of inverter switching points and/or adjustment of the extra tail current sources); compatible to existing common mode regulation schemes (e.g. replica biasing); simple and effective transistor-level implementation, etc.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

As defined above, embodiments can be embodied in the form of computer-implemented processes and apparatuses for practicing those processes. In exemplary embodiments, the invention is embodied in computer program code executed by one or more network elements. Embodiments include computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. Embodiments include computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalent may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. In a current mode logic (CML) delay cell circuit, a method for providing a wide tuning range and constant output swing, the method comprising:
    providing a CML delay cell having a nonlinear time constant as a function of the CML delay cell tuning voltage; and
    coupling a compensation circuit to the CML delay cell, the compensation circuit having a plurality of inverters that control weighted tail currents, each of the inverter switching points is determined by a transconductance ratio $\beta_N/\beta_{pN}$, the transconductance being determined by $\beta_x = KP_x \cdot W_x/L_x$ wherein KP is the mobility of transistor, W and L are transistors' channel width and length, respectively, and x is NMOS or PMOS.

2. The method as claimed in claim 1 wherein the ratio $\beta_{nN}/\beta_{pN}$ is $\beta_n = KP_n \cdot W_{NMOS}/L_{NMOS}/\beta_p = KP_p \cdot W_{PMOS}/L_{PMOS}$.

3. The method as claimed in claim further comprising providing different switching points for different values of tuning voltage.

4. The method as claimed in claim 3 further comprising compensating the nonlinear time constant by providing a weighted tail current for the different values of the tuning voltage until the time constant is defined as a linear function of the tuning voltage.

5. The method as claimed in claim 4 further comprising generating a plurality of auxiliary tail current source weights from sources of switching transistors residing in the CML delay cell.

* * * * *